US012683580B2

(12) United States Patent
Li

(10) Patent No.: US 12,683,580 B2
(45) Date of Patent: Jul. 14, 2026

(54) SINGLE CRYSTAL FILM BULK ACOUSTIC WAVE RESONATOR, AND PREPARATION METHOD AND APPLICATION THEREOF

(71) Applicant: HEYUAN AIFO LIGHT COMMUNICATION TECHNOLOGY CO., LTD., Guangdong (CN)

(72) Inventor: Guoqiang Li, Guangdong (CN)

(73) Assignee: HEYUAN AIFO LIGHT COMMUNICATION TECHNOLOGY CO., LTD., Guangdong (CN)

( * ) Notice: Subject to any disclaimer, the term of this patent is extended or adjusted under 35 U.S.C. 154(b) by 605 days.

(21) Appl. No.: 18/271,311

(22) PCT Filed: Dec. 20, 2022

(86) PCT No.: PCT/CN2022/140386
§ 371 (c)(1),
(2) Date: Jul. 7, 2023

(87) PCT Pub. No.: WO2023/116699
PCT Pub. Date: Jun. 29, 2023

(65) Prior Publication Data
US 2024/0305268 A1 Sep. 12, 2024

(30) Foreign Application Priority Data
Dec. 24, 2021 (CN) .......................... 202111597762.0

(51) Int. Cl.
*H03H 9/17* (2006.01)
*H03H 3/02* (2006.01)

(52) U.S. Cl.
CPC .............. *H03H 9/175* (2013.01); *H03H 3/02* (2013.01); *H03H 9/176* (2013.01); *H03H 2003/025* (2013.01)

(58) Field of Classification Search
None
See application file for complete search history.

(56) References Cited

U.S. PATENT DOCUMENTS

2019/0036592 A1* 1/2019 Shealy ................... H04B 1/006
2019/0190488 A1* 6/2019 Dasgupta ............... H03H 9/205
(Continued)

FOREIGN PATENT DOCUMENTS

CN 107342748 A * 11/2017 ............. H03H 9/174
CN 207339804 U * 5/2018
(Continued)

OTHER PUBLICATIONS

International Search Report dated Feb. 22, 2023 for International Application PCT/CN2022/140386.
(Continued)

*Primary Examiner* — William J Klimowicz
(74) *Attorney, Agent, or Firm* — Farjami & Farjami LLP

(57) ABSTRACT

A single crystal film bulk acoustic wave resonator includes a substrate layer, a Bragg reflection layer, a first bonding layer, a second bonding layer, a piezoelectric layer and an electrode layer; a width of the electrode layer is smaller than that of the piezoelectric layer. The resonator further includes a first silicon oxide layer and a second silicon oxide layer, which surround the first bonding layer and the second bonding layer respectively, and a plurality of first air holes horizontally arranged and a plurality of second air holes horizontally arranged are respectively formed in the first silicon oxide layer and the second silicon oxide layer. Each of the plurality of first air holes corresponds to and is (Continued)

communicated with a respective one of the plurality of second air holes. The piezoelectric layer is made of AlN or lithium niobate.

9 Claims, 2 Drawing Sheets

(56)                    References Cited

U.S. PATENT DOCUMENTS

| | | | |
|---|---|---|---|
| 2019/0222193 A1 | 7/2019 | Bader | |
| 2020/0389146 A1* | 12/2020 | Li | H03H 9/02015 |
| 2022/0149802 A1* | 5/2022 | An | C23C 16/303 |

FOREIGN PATENT DOCUMENTS

| | | | | |
|---|---|---|---|---|
| CN | 110324022 A | | 10/2019 | |
| CN | 111082770 A | * | 4/2020 | H03H 3/02 |
| CN | 111446944 A | * | 7/2020 | H03H 3/02 |
| CN | 112702038 A | | 4/2021 | |
| CN | 113437947 A | | 9/2021 | |
| CN | 113489467 A | | 10/2021 | |
| CN | 114499440 A | | 5/2022 | |
| WO | WO-2018063294 A1 | * | 4/2018 | H03H 9/175 |

OTHER PUBLICATIONS

Written Opinion dated Feb. 22, 2023 for International Application PCT/CN2022/140386.

* cited by examiner

SINGLE CRYSTAL FILM BULK ACOUSTIC WAVE RESONATOR, AND PREPARATION METHOD AND APPLICATION THEREOF

CROSS-REFERENCE TO RELATED APPLICATIONS

This application is a national stage filing under 35 U.S.C. § 371 of international application number PCT/CN2022/140386, filed Dec. 20, 2022, which claims priority to Chinese patent application No. 2021115977620 filed Dec. 24, 2021. The contents of these applications are incorporated herein by reference in their entirety.

TECHNICAL FIELD

The disclosure relates to the technical field of bulk acoustic wave resonators, and particularly to a single crystal film bulk acoustic wave resonator, and a preparation method and application thereof.

BACKGROUND

Development of wireless communication technology puts forward the requirements of miniaturization and high frequency on radio frequency front end devices. However, the traditional ceramic dielectric filter cannot meet the requirement of integration due to a large volume, while the acoustic surface wave filter cannot meet the requirement of high frequency due to the limitation of machining technology. The film bulk acoustic wave resonator converts an electrical signal with an extremely large wavelength into an acoustic signal with a small wavelength through a piezoelectric effect, and an acoustic wave is totally reflected at an interface between upper and lower electrodes and air, thus forming an interference effect. A frequency of the filter may be controlled by controlling a thickness of a piezoelectric film. With the innovation and development of semiconductor technology, a thickness of a piezoelectric material may be controlled to be several hundred nanometers, so that the film bulk acoustic wave resonator is suitable for high-frequency and miniaturized scenarios. The traditional bulk acoustic wave resonator is easily corroded by a solution released from a sacrificial layer due to a structural defect, thus having a poor performance. Meanwhile, a part of acoustic waves may leak into a surrounding substrate through the piezoelectric material, thus having a low quality factor. Moreover, the piezoelectric material of the traditional film bulk acoustic wave resonator is mostly polycrystalline material, and the polycrystalline piezoelectric material has a high defect density, which may also reduce the quality factor of the resonator.

SUMMARY

Aiming at the problems in the existing technology, the disclosure provides a single crystal film bulk acoustic wave resonator, and a preparation method and application thereof, and solves the problems of low quality factor and large insertion loss in an existing single crystal film bulk acoustic wave resonator. Technical solutions of the disclosure are as follows.

In a first aspect, an embodiment of the disclosure provides a single crystal film bulk acoustic wave resonator, which comprises a substrate layer, a Bragg reflection layer, a first bonding layer, a second bonding layer, a piezoelectric layer and an electrode layer sequentially from bottom to top, wherein a width of the electrode layer is smaller than that of the piezoelectric layer; the resonator further comprises a first silicon oxide layer and a second silicon oxide layer, the first silicon oxide layer and the second silicon oxide layer are arranged to surround the first bonding layer and the second bonding layer respectively, and a plurality of first air holes horizontally arranged and a plurality of second air holes horizontally arranged are respectively formed in the first silicon oxide layer and the second silicon oxide layer; each of the plurality of first air holes corresponds to and is communicated with a respective one of the plurality of second air holes; and the piezoelectric layer is made of AlN or lithium niobate.

Optionally, the substrate layer is made of silicon.

Further, the Bragg reflection layer has a structure of more than two layers, and is formed by molybdenum layer and silicon oxide layer.

Optionally, the Bragg reflection layer is provided with nine layers.

Further, the first bonding layer and the second bonding layer are respectively made of Au and Sn, and have a thickness ranging from 100 nm to 700 nm.

Further, the first silicon oxide layer and the second silicon oxide layer have a thickness ranging from 100 nm to 700 nm.

Further, the first air holes and the second air holes are arranged in a horizontal array.

Optionally, more than two first air holes and more than two second air holes are formed.

Preferably, six first air holes and six second air holes are formed.

Further, in the first air holes and the second air holes, a distance between adjacent air holes is a quarter of a wavelength of an acoustic wave.

In a second aspect, an embodiment of the disclosure provides a preparation method of the single crystal film bulk acoustic wave resonator, which comprises the following steps of:

(1) preparing two substrate layers: a first substrate layer and a second substrate layer, and preparing the Bragg reflection layer on a surface of the first substrate layer first;

(2) preparing the first bonding layer on the Bragg reflection layer through magnetron sputtering and carrying out a patterning treatment, preparing the first silicon oxide layer around the first bonding layer, and preparing the first air holes arranged periodically in the first silicon oxide layer;

(3) preparing the AlN piezoelectric layer or the lithium niobate piezoelectric layer on a surface of the second substrate layer;

(4) preparing the second bonding layer on an upper surface of the piezoelectric layer through magnetron sputtering and carrying out a patterning treatment, preparing the second silicon dioxide layer around the second bonding layer, and preparing the second air holes arranged periodically in the second silicon dioxide layer, wherein positions of the second air holes correspond to positions of the first air holes respectively;

(5) bonding a device obtained in step (4) with the first bonding layer of the a device obtained in step (2) in an inverted manner through the second bonding layer; and (6) removing the second substrate layer, and preparing the electrode layer at a top portion through magnetron sputtering to obtain the single crystal film bulk acoustic wave resonator.

Preferably, preparing the Bragg reflection layer in step (1) is realized by magnetron sputtering, PECVD or LPCVD.

Preferably, preparing the piezoelectric layer in step (3) is realized by alternating-current magnetron sputtering or MOCVD.

Preferably, the bonding in step (5) is hot pressing bonding.

In a third aspect, an embodiment of the disclosure provides an electronic element, which comprises the single crystal film bulk acoustic wave resonator above.

Further, the electronic element comprises a duplexer, a multiplexer and a bulk acoustic wave filter.

Compared with the existing technology, the disclosure has the following beneficial effects and advantages.

(1) According to the resonator of the disclosure, the silicon oxide layer is introduced in structure, which improves mechanical reliability of the resonator and reduces deformation of the bonding layer in a bonding process, the plurality of air holes horizontally arranged are formed in the silicon oxide layer, the arrangement of the air holes improves a reflection performance to the acoustic wave, reduces a loss of the transversely transmitted acoustic wave leaking to the substrate, and finally improves the quality factor of the resonator, and the reflection layer and the single crystal piezoelectric material cooperate to jointly improve the quality factor of the resonator, and reduce a power loss of the resonator.

(2) The preparation method of the resonator of the disclosure is simple and reliable, through which the high-quality single crystal film bulk acoustic wave resonator can be prepared. Compared with a traditional polycrystalline film bulk acoustic wave resonator, a crystal quality of the piezoelectric layer is greatly improved, a defect density is obviously reduced, an electromechanical coupling coefficient of the resonator is improved, and the insertion loss is reduced.

BRIEF DESCRIPTION OF THE DRAWINGS

In FIG. 1 to FIG. 9, 101 refers to first silicon substrate, 102 refers to Bragg reflection layer, 103 refers to first bonding layer, 104 refers to first silicon oxide layer, 105 refers to first air hole, 106 refers to second silicon substrate, 107 refers to piezoelectric layer, 108 refers to second bonding layer, 109 refers to second silicon oxide layer, 110 refers to second air hole, and 111 refers to electrode layer.

DETAILED DESCRIPTION

In the description of the disclosure, it should be noted that, if the specific conditions are not indicated in the embodiments, the conventional conditions or the conditions suggested by the manufacturer should be followed. If the manufacturer of the reagent or the instrument used is not indicated, the reagent or the instrument is regarded as a commercially available conventional product.

The disclosure is further described in detail hereinafter with the drawings and specific embodiments, so as to help those of ordinary skills in the art to have a more complete, accurate and in-depth understanding of the inventive concept and technical solution of the disclosure. The scope of protection of the disclosure comprises but is not limited to the following embodiments, and any modification to the details and forms of the technical solution of the disclosure should fall within the scope of protection of the disclosure without deviating from the gist and scope of the present application.

Embodiment One

Figure 8:
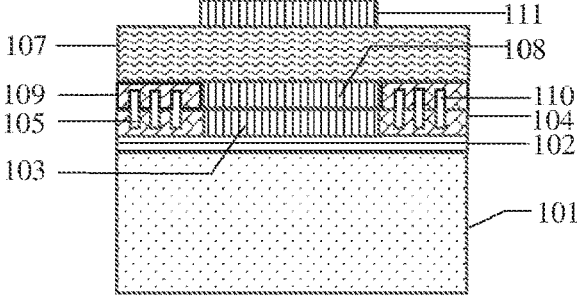
FIG. 8 is a cross-sectional view of the resonator finally prepared in Embodiment One of the disclosure.
Figure 9:
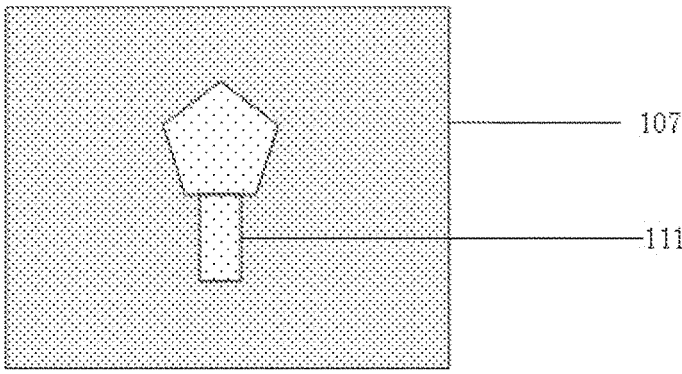
FIG. 9 is a top view of FIG. 8.

This embodiment provides a single crystal film bulk acoustic wave resonator, which has a structure shown in FIG. 8 and FIG. 9, and comprises a substrate layer 101, a Bragg reflection layer 102, a first bonding layer 103, a second bonding layer 108, a piezoelectric layer 107 and an electrode layer 111 sequentially from bottom to top. The resonator further comprises a first silicon oxide layer 104 and a second silicon oxide layer 109. The first silicon oxide layer 104 and the second silicon oxide layer 109 are arranged to surround the first bonding layer 103 and the second bonding layer 108 respectively, and a plurality of horizontally arranged first air holes 105 and a plurality of horizontally arranged second air holes 110 are respectively formed in the first silicon oxide layer 104 and the second silicon oxide layer 109. Each of the plurality of first air holes 105 corresponds to and is communicated with a respective one of the plurality of second air boles 110. The piezoelectric layer 107 is made of AlN.

The Bragg reflection layer 102 is composed of metal Mo layers and silicon oxide layers which are alternately arranged from bottom to top, and has a structure of a total of nine layers.

The piezoelectric layer 107 has a thickness of 1 μm.

The first bonding layer 103 is made of Au, the second bonding layer 108 is made of Sn, the Au layer has a thickness of 300 nm, the Sn layer has a thickness of 100 nm, and the first bonding layer 103 and the second bonding layer 108 have a total thickness of 400 nm.

The first silicon oxide layer 104 and the second silicon oxide layer 109 have a thickness of 400 nm.

The first air holes and the second air holes are arranged in a horizontal array, and six first air holes 105 and six second air holes 110 are formed. In the first air holes and the second air holes, a distance between adjacent air holes is a quarter of a wavelength of an acoustic wave.

The electrode layer 111 at a top portion is made of metal Mo, and has a thickness of 400 nm. A width of the electrode layer is smaller than that of the piezoelectric layer.

This embodiment further provides a preparation method of the single crystal film bulk acoustic wave resonator above, which comprises the following steps.

Figure 1:
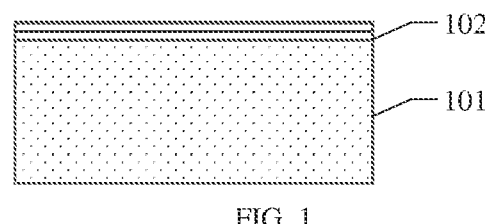
FIG. 1 is a cross-sectional view of a Bragg reflection layer on a first silicon substrate in Embodiment One of the disclosure.

(1) A Si (111) substrate is selected as the substrate 101, and the substrate is soaked in acetone and hydrofluoric acid buffer solutions sequentially and dried. A layer of metal Mo is prepared through magnetron sputtering and a layer of silicon oxide film is prepared through PECVD, the operations are carried out alternately, so as to prepare a total of nine Bragg reflection layers 102 (as shown in FIG. 1).

Figure 2:
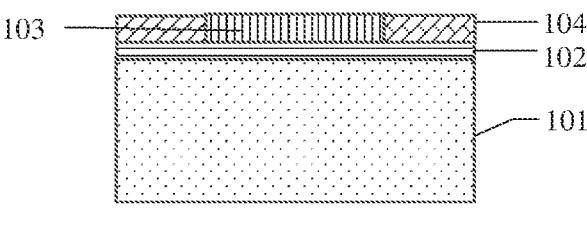
FIG. 2 is a cross-sectional view of a first bonding layer and a first silicon oxide layer on the Bragg reflection layer in Embodiment One of the disclosure.

(2) The Au bonding layer 103 is prepared on the Bragg reflection layer through magnetron sputtering, and then subjected to a patterning treatment, and the first silicon oxide layer 104 is prepared around the Au bonding layer 103 through PECVD (as shown in FIG. 2).

Figure 3:
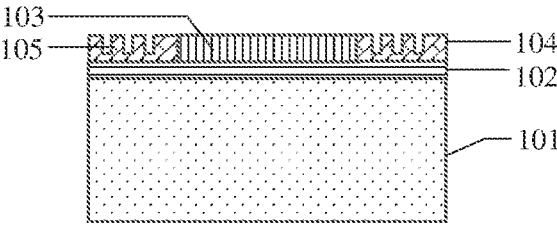
FIG. 3 is a cross-sectional view of first air holes in the first silicon oxide layer in Embodiment One of the disclosure.

(3) The silicon oxide layer 104 is etched through plasma etching to form the air holes 105 (as shown in FIG. 3).

Figure 4:
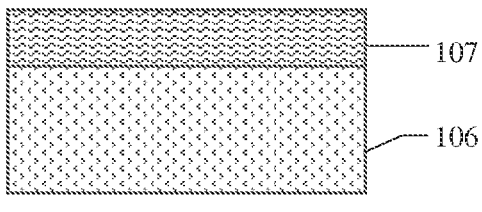
FIG. 4 is a cross-sectional view of a piezoelectric layer on a second silicon substrate in Embodiment One of the disclosure.

(4) A layer of aluminum nitride film 107 is deposited on a surface of the second silicon substrate 106 through alternating-current magnetron sputtering (as shown in FIG. 4).

Figure 5:
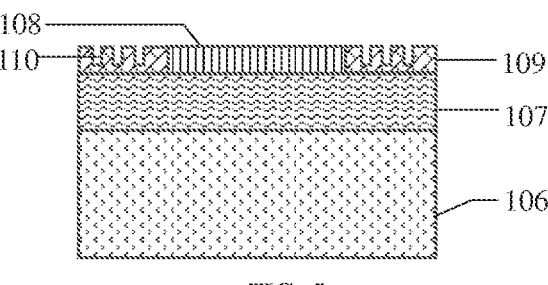
FIG. 5 is a cross-sectional view of a second bonding layer and a second silicon oxide layer on the piezoelectric layer and second air holes in Embodiment One of the disclosure.

(5) The Sn bonding layer 108 is deposited on a surface of the aluminum nitride film 107 through magnetron sputtering, and then subjected to a patterning treatment, the second silicon dioxide layer 109 is prepared around the Sn bonding layer 108 through PECVD, and finally the periodic air holes 110 are prepared through plasma etching (as shown in FIG. 5).

Figure 6:
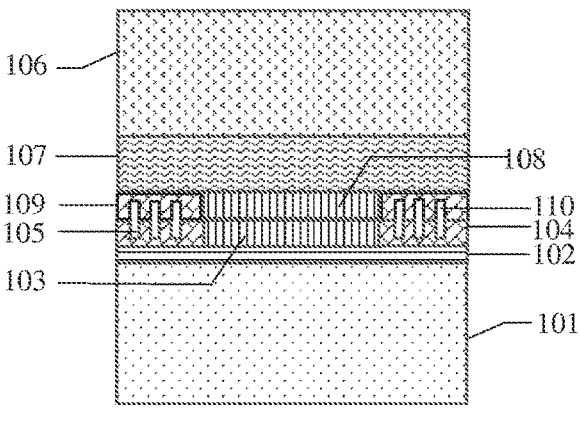
FIG. 6 is a cross-sectional view of bonding of the first bonding layer and the second bonding layer in Embodiment One of the disclosure.

(6) The first bonding layer 103 and the second bonding layer 108 (inverted) are subjected to hot pressing bonding (as shown in FIG. 6).

Figure 7:
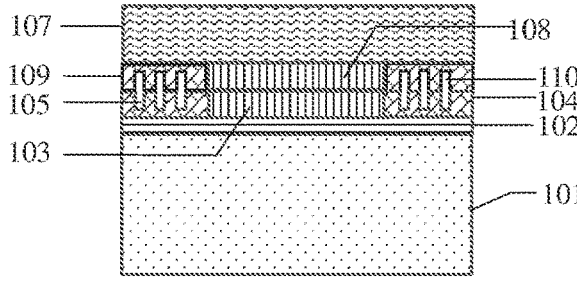
FIG. 7 is a cross-sectional view of the resonator after the second silicon substrate is removed in Embodiment One of the disclosure.

(7) The second silicon substrate 106 is removed through mechanical thinning (as shown in FIG. 7).

(8) The Mo electrode layer 111 at the top portion is prepared on the piezoelectric material through stripping (as shown in FIG. 8).

The resonator obtained in this embodiment has a quality factor of 3,200 and a power loss of about 0.02 watt.

Embodiment Two

This embodiment provides a single crystal film bulk acoustic wave resonator, which is different from that of Embodiment One in that: four Bragg reflection layers are provided, which are two silicon oxide layers and two Mo layers from bottom to top. The first bonding layer and the second bonding layer have a thickness of 700 nm.

The resonator obtained in this embodiment has a quality factor of 600 and a power loss of about 0.1 watt.

Embodiment Three

This embodiment provides a single crystal film bulk acoustic wave resonator, which is different from that of Embodiment One in that: two Bragg reflection layers are provided, which are one silicon oxide layer and one Mo layer from bottom to top. The first bonding layer and the second bonding layer have a thickness of 100 nm.

The resonator obtained in this embodiment has a quality factor of 200 and a power loss of about 0.3 watt.

Comparative Example One

This comparative example provides an existing polycrystalline resonator, a structure of which comprises a silicon cavity, a bottom electrode, a piezoelectric layer and a top electrode, and the polycrystalline resonator is a conventional resonator in the field, and will not be described in detail herein. The bottom electrode and the top electrode have a thickness of 400 nm, and the piezoelectric layer AlN has a thickness of 1 μm.

The resonator obtained in this comparative example has a quality factor of 700 and a power loss of about 0.09 watt.

TABLE 1

Performance parameters of resonators of Embodiments One to Three and Comparative Example One

| Case | Quality factor | Power loss |
|---|---|---|
| Embodiment One | 3200 | 0.02 |
| Embodiment Two | 600 | 0.1 |
| Embodiment Three | 200 | 0.3 |
| Comparative Example One | 700 | 0.09 |

The data in Table I show that the single crystal film bulk acoustic wave resonator obtained in Embodiment One has the best quality factor and the lowest power loss, wherein the quality factor is 3.57 times higher than that of the existing resonator, and the power loss is reduced by 77.78%. The single crystal film bulk acoustic wave resonators obtained in Embodiments Two and Three are much worse than that of Embodiment One, but performance parameters of the resonators are barely acceptable.

The above embodiments merely express several embodiments of the disclosure, and the descriptions thereof are relatively specific and detailed, but cannot be understood as a limitation to the scope of the invention patent. It should be noted that those of ordinary skills in the art may make a plurality of transformations and improvements without departing from the conception of the disclosure, and these transformations and improvements should all fall within the scope of protection of the disclosure. Therefore, the scope of protection of the invention patent should be subjected to the claims appended.

The invention claimed is:

1. A single crystal film bulk acoustic wave resonator, comprising a substrate layer, a Bragg reflection layer, a first bonding layer, a second bonding layer, a piezoelectric layer and an electrode layer sequentially from bottom to top, wherein a width of the electrode layer is smaller than a width of the piezoelectric layer; the resonator further comprises a first silicon oxide layer and a second silicon oxide layer, the first silicon oxide layer and the second silicon oxide layer are arranged to surround the first bonding layer and the second bonding layer respectively, and a plurality of first air holes horizontally arranged and a plurality of second air holes horizontally arranged are respectively formed in the first silicon oxide layer and the second silicon oxide layer; each of the plurality of first air holes corresponds to and is communicated with a respective one of the plurality of second air holes; and the piezoelectric layer is made of AlN or lithium niobate.

2. The single crystal film bulk acoustic wave resonator according to claim 1, wherein the Bragg reflection layer has a structure of more than two layers, and is formed by molybdenum layer and silicon oxide layer.

3. The single crystal film bulk acoustic wave resonator according to claim 2, wherein the Bragg reflection layer is provided with nine layers.

4. The single crystal film bulk acoustic wave resonator according to claim 1, wherein the first bonding layer and the second bonding layer are respectively made of Au and Sn, and have a thickness ranging from 100 nm to 700 nm.

5. The single crystal film bulk acoustic wave resonator according to claim 1, wherein the first silicon oxide layer and the second silicon oxide layer have a thickness ranging from 100 nm to 700 nm.

6. The single crystal film bulk acoustic wave resonator according to claim 1, wherein the first air holes and the second air holes are arranged in a horizontal array.

7. The single crystal film bulk acoustic wave resonator according to claim 6, wherein more than two first air holes and more than two second air holes are formed.

8. The single crystal film bulk acoustic wave resonator according to claim 6, wherein in the first air holes and the second air holes, a distance between adjacent air holes is a quarter of a wavelength of an acoustic wave.

9. A preparation method of the single crystal film bulk acoustic wave resonator according to claim 1, further comprising the following steps of:

(1) preparing two substrate layers: a first substrate layer and a second substrate layer, and preparing the Bragg reflection layer on a surface of the first substrate layer first;

(2) preparing the first bonding layer on the Bragg reflection layer through magnetron sputtering and carrying out a patterning treatment, preparing the first silicon oxide layer around the first bonding layer, and preparing the first air holes arranged periodically in the first silicon oxide layer;

(3) preparing the AlN piezoelectric layer or the lithium niobate piezoelectric layer on a surface of the second substrate layer;

(4) preparing the second bonding layer on an upper surface of the piezoelectric layer through magnetron sputtering and carrying out a patterning treatment, preparing the second silicon oxide layer around the second bonding layer, and preparing the second air holes arranged periodically in the second silicon oxide layer, wherein positions of the second air holes correspond to positions of the first air holes respectively;

(5) bonding a device obtained in step (4) with the first bonding layer of a device obtained in step (2) in an inverted manner through the second bonding layer; and (6) removing the second substrate layer, and preparing the electrode layer at a top portion through magnetron sputtering to obtain the single crystal film bulk acoustic wave resonator.

* * * * *